(12) United States Patent
Zhu et al.

(10) Patent No.: US 12,727,091 B2
(45) Date of Patent: Sep. 1, 2026

(54) CIRCUIT BOARD ASSEMBLY AND METHOD OF MANUFACTURING THE SAME, PACKAGING STRUCTURE HAVING THE SAME

(71) Applicants: HongQiSheng Precision Electronics (QinHuangDao) Co., Ltd., Qinhuangdao (CN); Avary Holding (Shenzhen) Co., Limited., Shenzhen (CN); GARUDA TECHNOLOGY CO., LTD., New Taipei (TW)

(72) Inventors: Chang-He Zhu, Qinhuangdao (CN); Yang Li, Shenzhen (CN); Jian Wang, Qinhuangdao (CN); Li-Kun Liu, Shenzhen (CN); Yan-Lu Li, Shenzhen (CN)

(73) Assignees: HongQiSheng Precision Electronics (QinHuangDao) Co., Ltd., Qinhuangdao (CN); Avary Holding (Shenzhen) Co., Limited., Shenzhen (CN); GARUDA TECHNOLOGY CO , LTD., New Taipei (TW)

( * ) Notice: Subject to any disclaimer, the term of this patent is extended or adjusted under 35 U.S.C. 154(b) by 196 days.

(21) Appl. No.: 18/385,707

(22) Filed: Oct. 31, 2023

(65) Prior Publication Data

US 2024/0147629 A1 May 2, 2024

Related U.S. Application Data

(63) Continuation-in-part of application No. PCT/CN2022/128372, filed on Oct. 28, 2022.

(51) Int. Cl.
*H05K 3/10* (2006.01)
*H05K 1/11* (2006.01)
(Continued)

(52) U.S. Cl.
CPC ............ *H05K 3/103* (2013.01); *H05K 1/111* (2013.01); *H05K 3/0017* (2013.01); *H05K 3/022* (2013.01);
(Continued)

(58) Field of Classification Search
CPC ...... H05K 3/103; H05K 1/111; H05K 3/0017; H05K 3/022; H05K 2203/049;
(Continued)

(56) References Cited

U.S. PATENT DOCUMENTS 7,492,594 B2 * 2/2009 Pal .................... H05K 7/20927 361/689
9,763,344 B2 * 9/2017 Ott ...................... H05K 5/0082
(Continued)

FOREIGN PATENT DOCUMENTS

CN 105792504 A 7/2016
CN 107958894 A 4/2018
(Continued)

*Primary Examiner* — Timothy J Thompson
(74) *Attorney, Agent, or Firm* — ScienBiziP, P.C.

(57) ABSTRACT

A circuit board assembly and a packaging structure are provided. A method of manufacturing the circuit board includes: providing a circuit substrate, the circuit substrate having a base layer, a wiring layer formed on the base layer, and a conductive casing formed on the wiring layer, the conductive casing defining a cavity for exposing the wiring layer; mounting an electronic component in the cavity, the electronic component electrically connected to the exposed wiring layer; filling a heat conductive medium in the cavity, the electronic component immersed in the heat conductive medium; forming a conductive cover on the conductive casing, the conductive cover enclosing the conductive casing.

12 Claims, 13 Drawing Sheets

100

(51) Int. Cl.
*H05K 3/00* (2006.01)
*H05K 3/02* (2006.01)

(52) U.S. Cl.
CPC .................. *H05K 2203/049* (2013.01); *H05K 2203/0723* (2013.01)

(58) Field of Classification Search
CPC ........... H05K 2203/0723; H05K 3/188; H05K 1/0204; H05K 1/185; H05K 1/0206; H05K 1/0209; H05K 3/284; H05K 2201/10371; H05K 2203/1316
See application file for complete search history.

(56) References Cited

U.S. PATENT DOCUMENTS

| | | | | |
|---|---|---|---|---|
| 10,681,846 | B2 * | 6/2020 | Iyengar | G06F 1/20 |
| 10,966,352 | B2 * | 3/2021 | Iyengar | H01L 23/427 |
| 2013/0314878 | A1 * | 11/2013 | Ott | H05K 3/284 361/728 |

FOREIGN PATENT DOCUMENTS

| | | | |
|---|---|---|---|
| CN | 108124411 | A | 6/2018 |
| CN | 112020199 | A | 12/2020 |
| CN | 112020222 | A | 12/2020 |

* cited by examiner

CIRCUIT BOARD ASSEMBLY AND METHOD OF MANUFACTURING THE SAME, PACKAGING STRUCTURE HAVING THE SAME

FIELD

The subject matter herein generally relates to package and heat dissipation of circuit boards, and more particularly, to a circuit board assembly, a method of manufacturing the circuit board assembly, and a packaging structure having the circuit board assembly.

BACKGROUND

In the field of package, a packaging substrate may include copper posts to realize electrical connection between different wiring layers. Such connection manner allows the packaging structure to have small size, and further reduces a distance between adjacent solder pads to improve the density of various electronic components or wirings.

However, when the density of the components is reduced, heat generated by the components is difficult to be dissipated, which results in a rapid raise of temperature. Thus, the working efficiency, quality, and service life of the components are reduced. Furthermore, when the density of the components is reduced, an electromagnetic interference between adjacent electronic components is increased, which affects the quality of signal transmission.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

Figure 1:
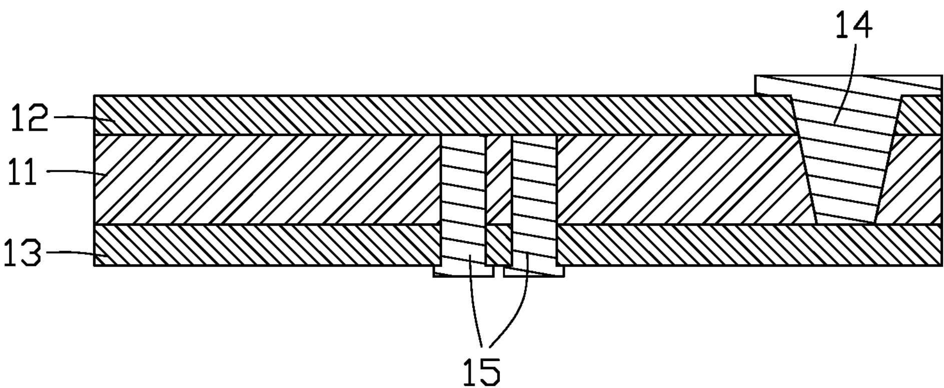
FIG. 1 is a cross-section view of a copper laminate according to an embodiment of the present application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 12:
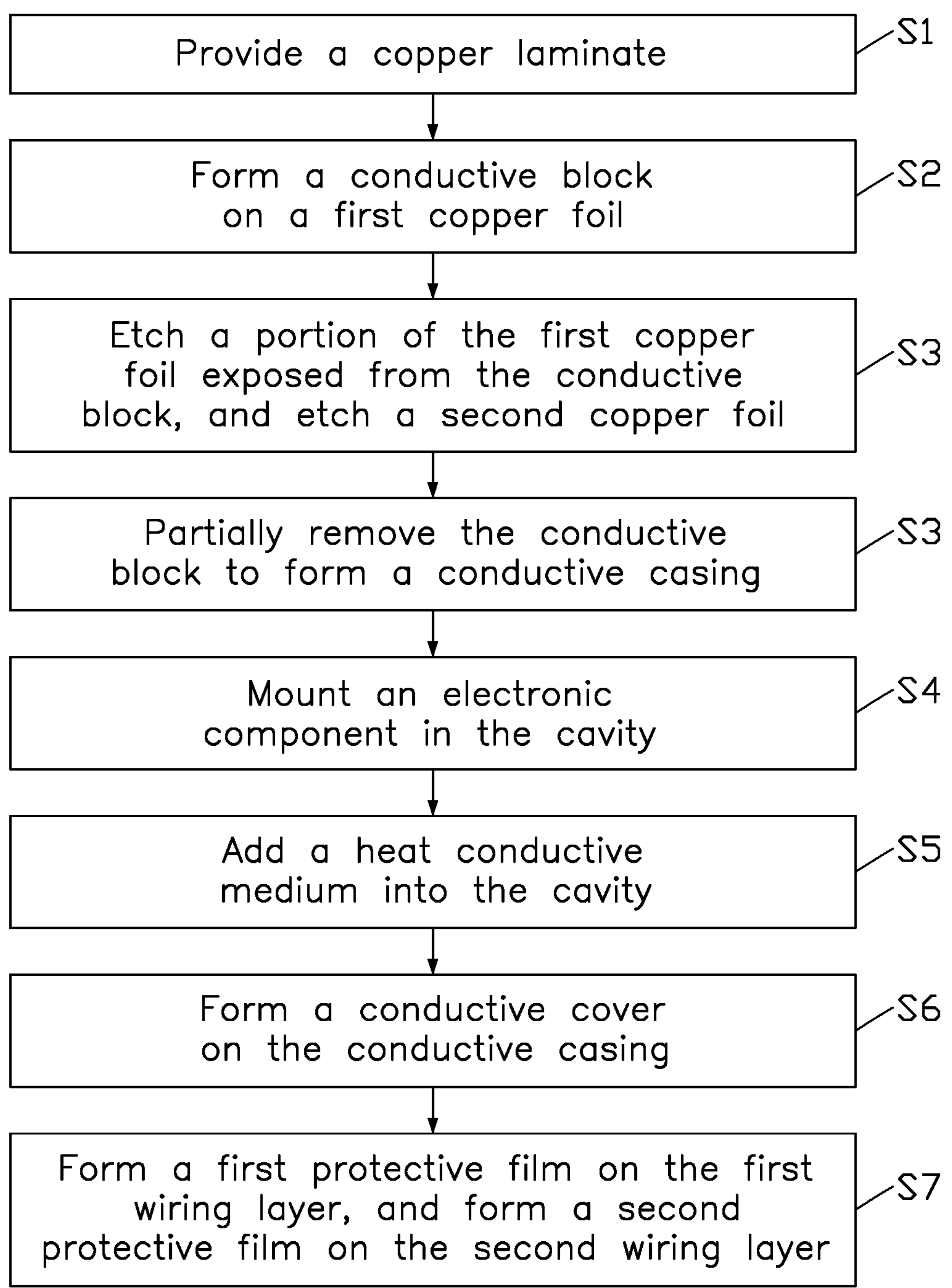
FIG. 12 is a flowchart of a method of manufacturing a circuit board assembly according to an embodiment of the present application.

FIG. 12 illustrates a flowchart of a method of manufacturing a circuit board assembly in accordance with an embodiment. The method is provided by way of embodiments, as there are a variety of ways to carry out the method. Each block shown in FIG. 12 represents one or more processes, methods, or subroutines carried out in the method. Furthermore, the illustrated order of blocks can be changed. Additional blocks may be added or fewer blocks may be utilized, without departing from this disclosure. The method can begin at step S1.

Step S1, referring to FIG. 1, a copper laminate 10 is provided, which is a double-sided copper laminate including a base layer 11, a first copper foil 12, a second copper foil 13, a first conductive body 14, and at least one second conductive body 15.

The first copper foil 12 and the second copper foil 13 are formed on two opposite surfaces of the base layer 11.

The first conductive body 14 extends through the first copper foil 12 and the base layer 11. The first conductive body 14 is substantially T-shaped. One end of the first conductive body 14 is connected to the second copper foil 13, and another end of the first conductive body 14 protrudes from and is formed on the first copper foil 12.

The second conductive body 15 extends through the second copper foil 13 and the base layer 11. The second conductive body 15 is substantially cylindrical. One end of the second conductive body 15 is connected to the first copper foil 12, and another end of the second conductive body 15 protrudes from and is formed on the second copper foil 13. The second conductive body 15 is used for heat conduction or electrically connection purpose. In at least one embodiment, the copper laminate 10 includes two second conductive bodies 15.

Figure 2:
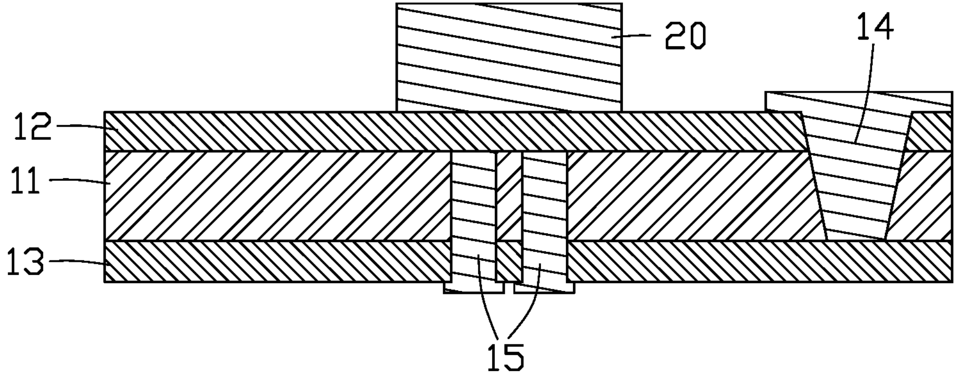
FIG. 2 is a cross-section view illustrating a conductive block being formed on the copper laminate shown in FIG. 1.

Step S2, referring to FIG. 2, a conductive block 20 is formed on the first copper foil 12, and the conductive block 20 corresponds to the second conductive body 15.

In at least one embodiment, the conductive block 20 may be formed by welding, adhering, electroplating, or chemical copper depositing. The conductive block 20 is cylindrical. In other embodiments, the conductive block 20 may also have a shape of prism or truncated cone.

Figure 3:
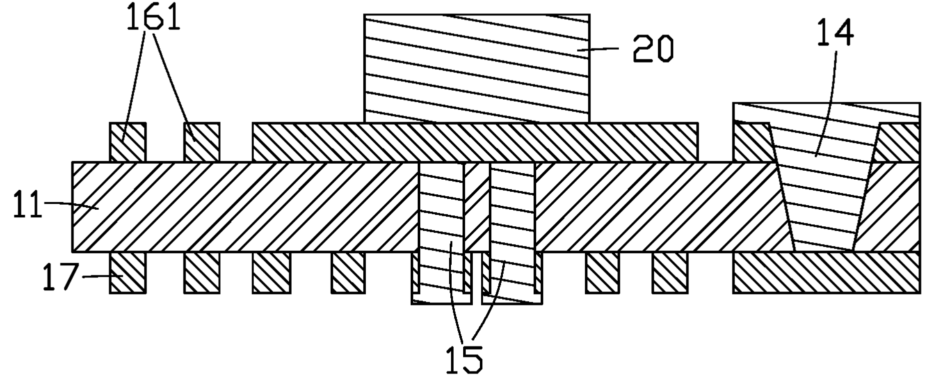
FIG. 3 is a cross-section view illustrating copper layers of the copper laminate shown in FIG. 2 being etched to formed wiring layers.

Step S3, referring to FIG. 3, a portion of the first copper foil 12, which is exposed from the conductive block 20, is etched to form a number of first wirings 161. The second copper foil 13 is etched to form a second wiring layer 17.

Figure 4:
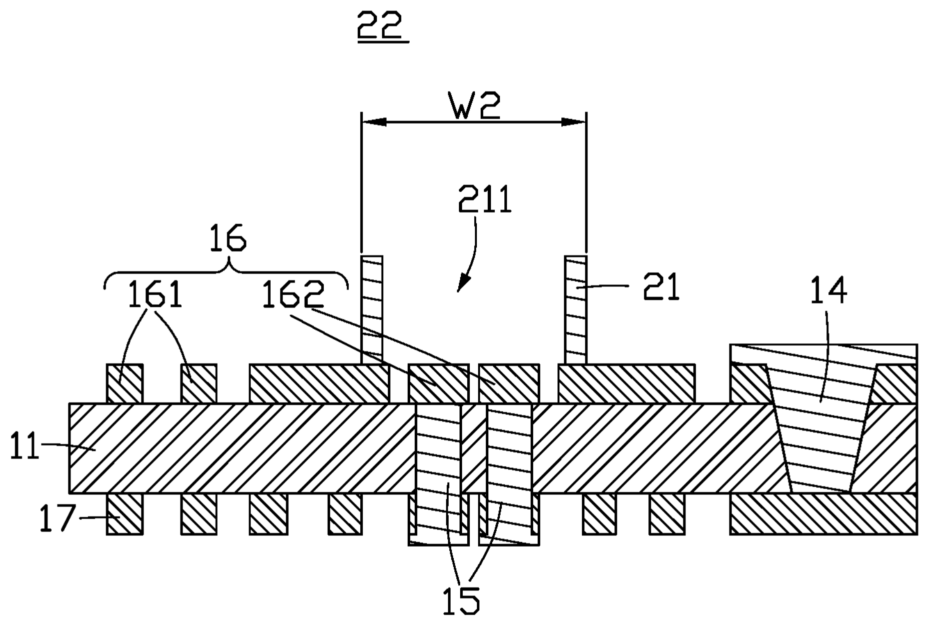
FIG. 4 is a cross-section view illustrating the conductive block shown in FIG. 3 being hollowed.

Step S4, referring to FIG. 4, the conductive block 20 is partially removed to form a conductive casing 21. The conductive casing 21 includes a cavity 211 to expose the remaining portion of the first copper foil 12. The remaining portion of the first copper foil 12 is etched to form at least one pad 162. Then, a circuit substate 22 is obtained.

The pad 162 is connected to the second conductive body 15. The first wirings 161 and the pad 162 cooperatively form a first wiring layer 16.

In other embodiments, the conductive casing 21 may be directly formed on the first copper foil 12 by selective plating. For example, a dry film (not indicated) is first formed on the first copper foil 12. Then, the dry film is subjected to an expose and development process to form a photosensitive pattern, and the photosensitive pattern includes an annular groove (not indicated). Then, the conductive casing 21 is formed by electroplating in the annular groove, and the dry film is removed. Finally, the entire first copper foil 12 is etched to form the first wiring layer 16.

Figure 5:
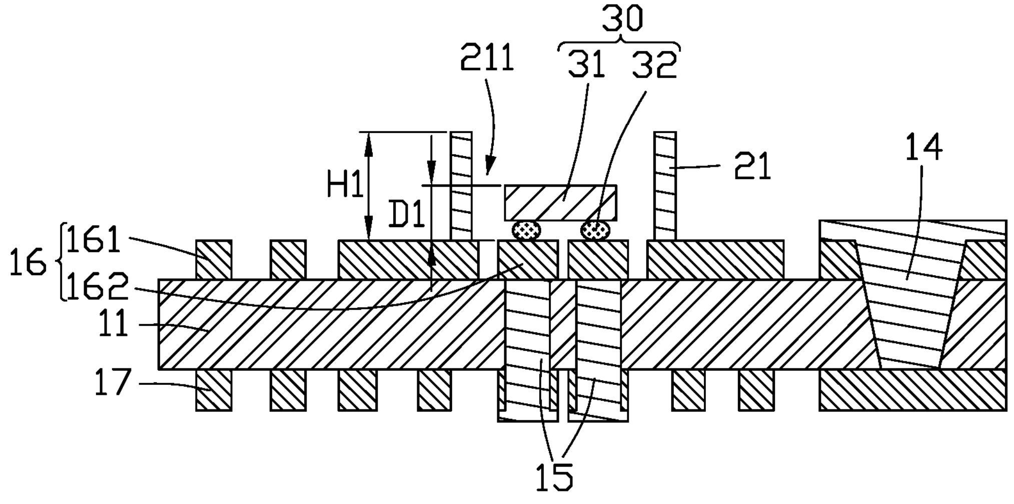
FIG. 5 is a cross-section view illustrating an electronic device being formed in the conductive casing shown in FIG. 4.

Step S5, referring to FIG. 5, an electronic component 30 is mounted in the cavity 211. The electronic component 30 includes a main body 31 and at least one pin 32 connected to the main body 31. The pin 32 is connected to the pad 162.

In at least one embodiment, a height $D_1$ of the electronic component 30 is less than a depth $H_1$ of the cavity 211. For example, the depth $H_1$ is approximately 20 microns larger than the height $D_1$. The electronic component 30 may be a chip, and the pin 32 may be connected to the pad 162 by welding.

Figure 6:
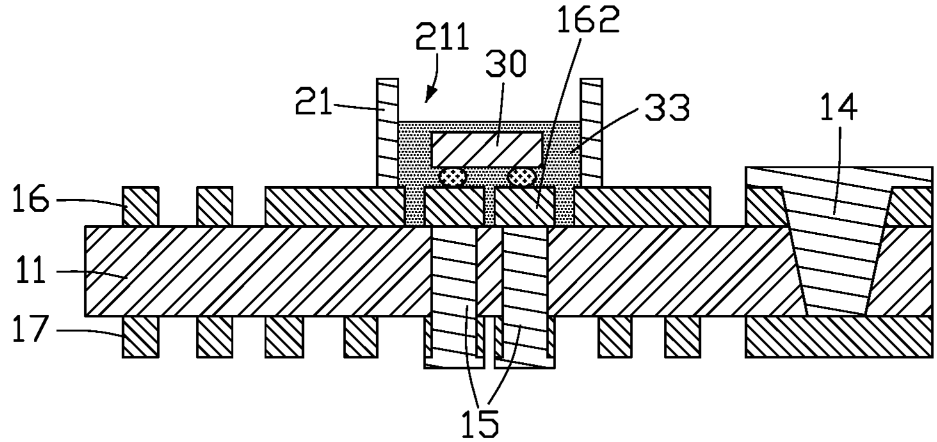
FIG. 6 is a cross-section view illustrating a heat conductive medium being filled in the conductive casing shown in FIG. 5.

Step S6, referring to FIG. 6, a heat conductive medium 33 is added into the cavity 211. The electronic component 30 is immersed in the heat conductive medium 33.

In at least one embodiment, the heat conductive medium 33 is an insulating liquid with a high specific heat capacity, such as fluorinated liquid. The temperature of the fluorinated liquid may only increase by 1 Celsius degree after absorbing a large amount of heat.

The heat conductive medium 33 may infill the gap between the inner surfaces of the cavity 211 and the electronic component 30. The heat conductive medium 33 may further infill the gap between adjacent pads 162. The heat conductive medium 33 further covers a top surface of the electronic component 30. In at least one embodiment, a top surface of the heat conductive medium 33 is at least 10 microns higher than the top surface of the electronic component 30, thereby ensuring that the electronic component 30 is completely embedded in the heat conductive medium 33 to improve the heat dissipation effect.

Figure 7:
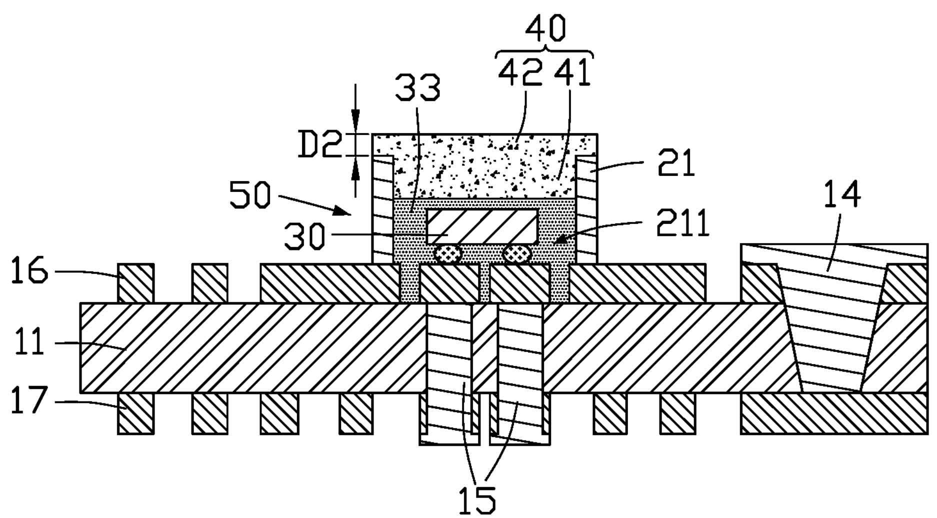
FIG. 7 is a cross-section view illustrating a conductive cover formed on the conductive casing shown in FIG. 6.

Step S7, referring to FIG. 7, a conductive cover 40 is formed on the conductive casing 21. The conductive cover 40 encloses the cavity 211.

In the present embodiment, the conductive cover 40, the conductive casing 21, and a portion of the first wiring layer 16 cooperatively form an electromagnetic shield 50. Thus, electromagnetic shielding of the electronic component 30 in the electromagnetic shield 50 can be achieved.

In at least one embodiment, the conductive cover 40 includes a first portion 41 and a second portion 42 connected to the first portion 41. The second portion 42 is wider than the first portion 41. The first portion 41 is inserted into the cavity 211 and connected to the inner sidewall of the cavity 211, thereby blocking the heat conductive medium 33 and preventing the heat conductive medium 33 from flowing out of the cavity 211. The second portion 42 is located out of the cavity 211 and on a top end of the conductive casing 21. The second portion 42 is used for electrically connecting other components. A thickness of the second portion 42 is at least 10 microns, thereby ensuring the electrical connection.

In at least one embodiment, the conductive cover 40 includes a solder paste, which can be formed on the conductive casing 21 by printing.

Figure 8:
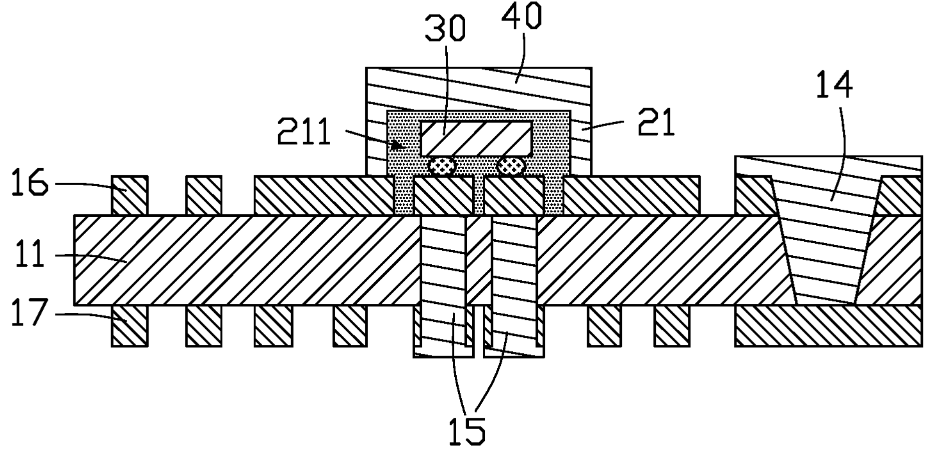
FIG. 8 is another cross-section view illustrating a conductive cover formed on the conductive casing shown in FIG. 6.

In other embodiments, referring to FIG. 8, the conductive cover 40 may be formed at the top end of the conductive casing 21 by electroplating or chemical depositing. For example, a conductive film (not shown) is first formed on the heat conductive medium 33, and the conductive film is electrically connected to the inner sidewall of the conductive casing 21. Then, the conductive cover 40 is formed on the conductive film by electroplating. The conductive cover 40 may include a conductive metal such as copper or tin.

Figure 9:
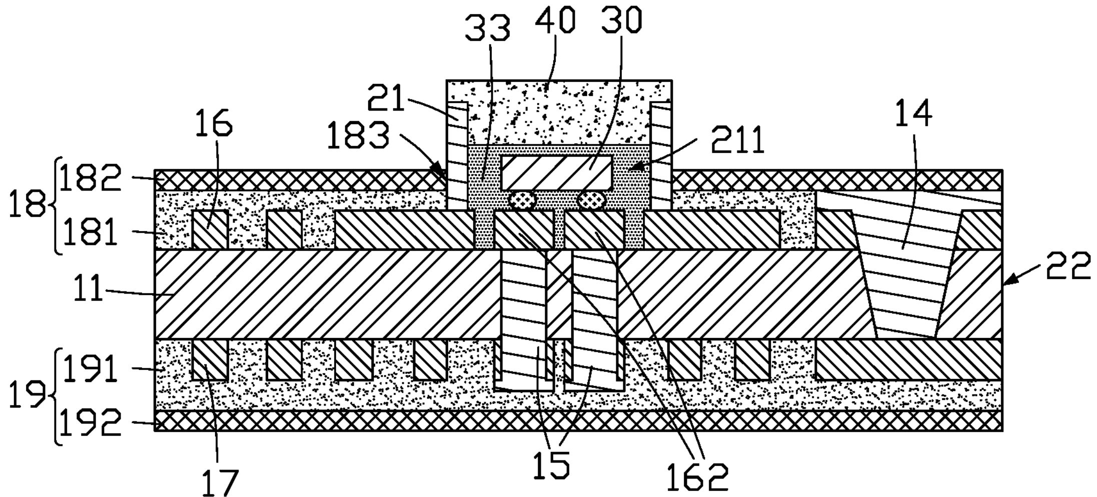
FIG. 9 is a cross-section view illustrating protective films formed on the wiring layers of FIG. 7 to obtain a circuit board assembly.

Step S8, referring to FIG. 9, a first protective film 18 is formed on the first wiring layer 16, and a second protective film 19 is formed on the second wiring layer 17. Then, the circuit board assembly 100 is obtained. The first protective film 18 defines a window 183 for the conductive casing 21 to extend through. The first protective film 18 and the second protective film 19 are used for insulating protection.

In at least one embodiment, the first protective film 18 includes a first adhesive layer 181 and a first protective layer 182, and the first adhesive layer 181 is between the first protective layer 182 and the first wiring layer 16. The second protective film 19 includes a second adhesive layer 191 and a second protective layer 192, and the second adhesive layer 191 is between the second protective layer 192 and the second wiring layer 17. In another embodiment, at least one of the first protective layer 181 and the second protective layer 191 may also be omitted. In other embodiments, at least one of the first protective film 18 and the second protective film 19 may also be omitted.

In the present application, by providing the conductive cover 40 on the conductive casing 21, the conductive cover 40 can block the heat conductive medium 33 in the conductive casing 21, and further function as a pad for connecting to other components (such as circuit boards). Thus, the space utilization rate of the circuit board assembly 100 is increased. The density of the electronic component 30, the first conductive body 14, and the second conductive body 15 is also increased.

By filling the conductive casing 21 with the heat conductive medium 33, the heat conductive medium 33 can immerse the electronic component 30 therein, thereby improving the heat dissipation efficiency of the electronic component 30 and avoiding the rapid temperature rise caused by heat accumulation.

By forming the electromagnetic shield 50 including the conductive cover 40, the conductive casing 21, and the first wiring layer 16 which are electrically connected together, the electromagnetic shielding of the electronic component 30 can be realized. Thus, the magnetic interference between the electronic component 30 and other components is reduced, and the quality of signal transmission is improved.

Referring to FIG. 9, a circuit board assembly 100 is also provided according to an embodiment of the present application. The circuit board assembly 100 includes a circuit substate 22, an electronic component 30, a heat conductive medium 33, and a conductive cover 40. The packaging substrate includes a base layer 11, a first wiring layer 16, a second wiring layer 17, and a conductive casing 21. The first wiring layer 16 and the second wiring layer 17 are formed on two opposite surfaces of the base layer 11. One end of the conductive casing 21 is formed on the first wiring layer 16. The conductive casing 21 defines a cavity 211 for exposing the first wiring layer 16. The electronic component 30 is mounted in the cavity 211 of the conductive casing 21 and electrically connected to the exposed first wiring layer 16. The heat conductive medium 33 is filled in the cavity 211 of the conductive casing 21, and the electronic component 30 is immersed in the heat conductive medium 33. The conductive cover 40 is formed on the conductive casing 21 and encloses the conductive casing 21.

In at least one embodiment, the circuit board assembly 100 further includes a first protective film 18 and a second protective film 19. The first protective film 18 is formed on the first wiring layer 16, and the second protective film 19 is formed on the second wiring layer 17. The first protective film 18 includes a first adhesive layer 181 and a first protective layer 182, and the first adhesive layer 181 is between the first protective layer 182 and the first wiring layer 16. The second protective film 19 includes a second adhesive layer 191 and a second protective layer 192, and the second adhesive layer 191 is between the second protective layer 192 and the second wiring layer 17.

Figure 13:
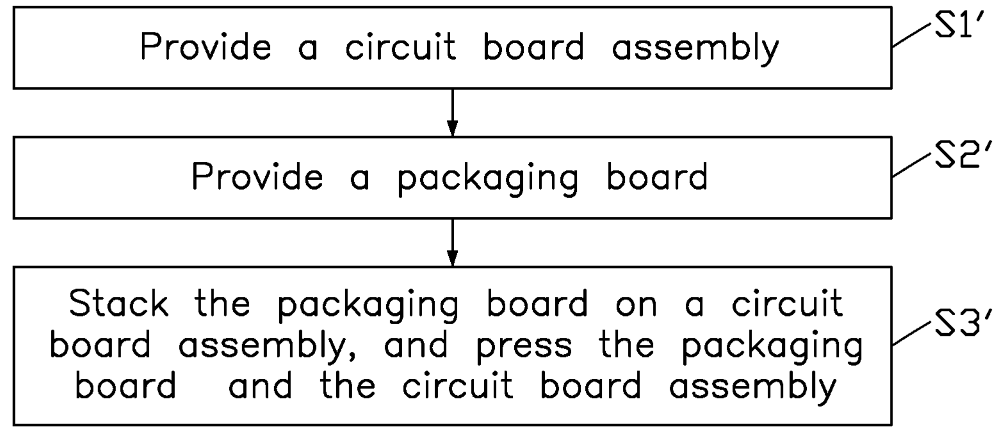
FIG. 13 is a flowchart of a method of manufacturing a packaging structure according to an embodiment of the present application.

FIG. 13 illustrates a flowchart of a method of manufacturing a packaging structure in accordance with an embodiment. The method is provided by way of embodiments, as there are a variety of ways to carry out the method. Each block shown in FIG. 13 represents one or more processes, methods, or subroutines carried out in the method. Furthermore, the illustrated order of blocks can be changed. Additional blocks may be added or fewer blocks may be utilized, without departing from this disclosure. The method can begin at step S1'.

Step S1', referring to FIG. 9, the above-mentioned circuit board assembly 100 is provided.

Figure 10:
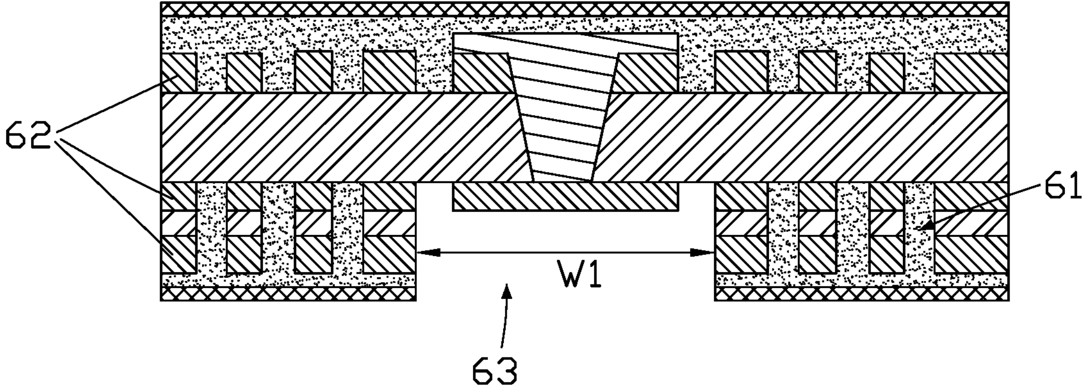
FIG. 10 is a cross-section view illustrating a packaging board according to an embodiment of the present application.

Step S2', referring to FIG. 10, a packaging board 60 is provided, which includes an insulator 61 and a number of inner wiring layers 62. The inner wiring layers 62 are embedded in the insulator 61 and spaced from each other. The packaging board 60 defines a slot 63, and a portion of one of the inner wiring layers 62 is exposed from the slot 63.

Figure 11:
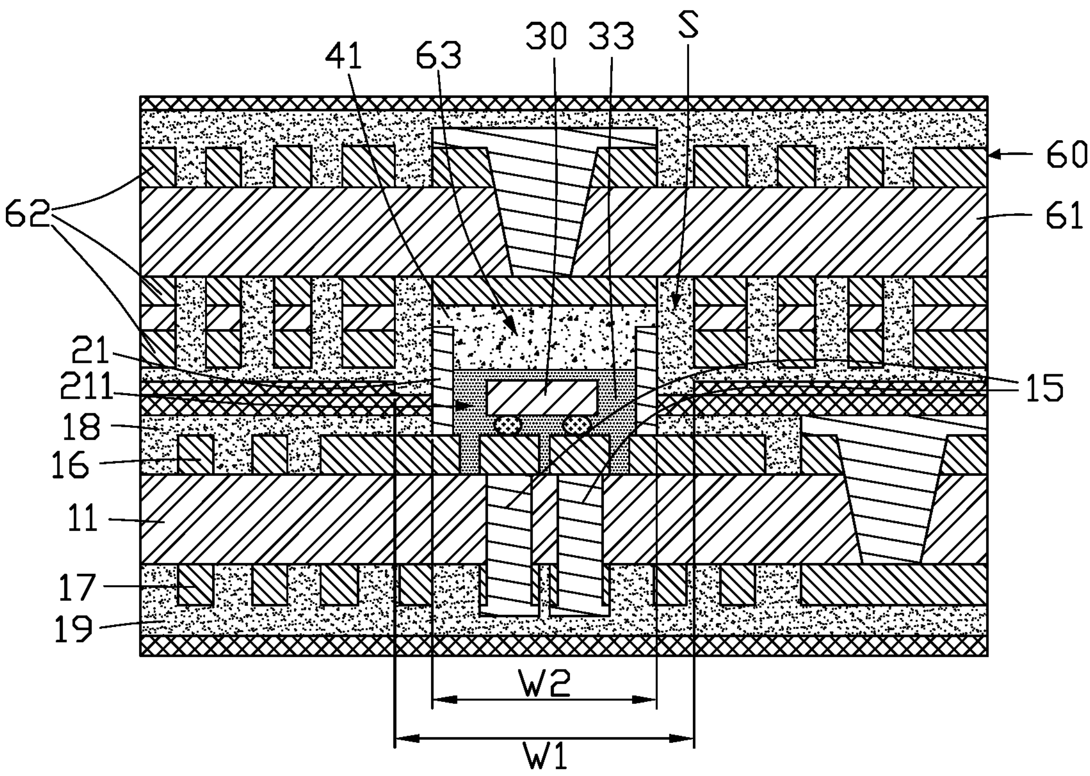
FIG. 11 is a cross-section view illustrating the circuit board assembly of FIG. 9 and the packaging board of FIG. 10 being pressed to form a packaging structure.

Step S3', referring to FIG. 11, the packaging board 60 is stacked on the circuit board assembly 100 to cause the slot 63 to face the conductive casing 21. Then, the packaging board 60 and the circuit board assembly 100 are pressed to cause the conductive casing 21 to enter the slot 63 and the conductive cover 40 to connected to the exposed inner wiring layer 62. Then, the packaging structure 200 is obtained.

In at least one embodiment, the slot 63 has a width defined as $W_1$. The conductive casing 21 has a width defined as $W_2$. The width $W_1$ of the slot 63 is larger than the width $W_2$ of the conductive casing 21, such that a gap S is formed between the inner sidewall of the slot 63 and the outer wall of the conductive casing 21. The width of the gap S may be larger than 50 microns. When pressing the packaging board 60 and the circuit board assembly 100, the insulator 61 may be partially filled into the gap S, thereby improving the bonding strength between the packaging board 60 and the circuit board assembly 100.

Referring to FIG. 11, a packaging structure 200 is also provided according to an embodiment of the present application. The packaging structure 200 includes a packaging board 60 and the above-mentioned circuit board assembly 100. The packaging board 60 includes an insulator 61 and a number of inner wiring layer 62 embedded in the insulator 61. The packaging board 60 defines a slot 63, and a portion of one of the inner wiring layers 62 is exposed from the slot 63. The conductive casing 21 is partially received in the slot 63. The conductive cover 40 is electrically connected to the exposed inner wiring layer 62.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A circuit board assembly comprising:

a circuit substrate comprising a base layer, a wiring layer formed on the base layer, and a conductive casing formed on the wiring layer, the conductive casing defining a cavity for exposing the wiring layer;

an electronic component mounted in the cavity, the electronic component electrically connected to the exposed wiring layer;

a heat conductive medium filled in the cavity, the electronic component immersed in the heat conductive medium;

a conductive cover formed on the conductive casing, the conductive cover enclosing the conductive casing; and a first protective film on the first wiring layer, wherein the first protective film defines a window configured for the conductive casing to pass through.

2. The circuit board assembly of claim 1, wherein the wiring layer comprises a pad exposed from the cavity, the electronic component comprises a main body and a pin connected to the main body, and the pin is connected to the pad.

3. The circuit board assembly of claim 1, wherein the conductive cover comprises a first portion and a second portion wider than the first portion, the first portion is inserted into the conductive casing, and the second portion is located on a top end of the conductive casing.

4. The circuit board assembly of claim 3, wherein a thickness of the second portion is at least 10 microns.

5. The circuit board assembly of claim 2, wherein the circuit substrate further comprises a conductive body, and the conductive body extends through the base layer and connected to the pad.

6. A packaging structure comprising:

a circuit board assembly comprising:

a circuit substrate comprising a base layer, a wiring layer formed on the base layer, and a conductive casing formed on the wiring layer, the conductive casing defining a cavity for exposing the wiring layer;

an electronic component mounted in the cavity, the electronic component electrically connected to the exposed wiring layer;

a heat conductive medium filled in the cavity, the electronic component immersed in the heat conductive medium; and a conductive cover formed on the conductive casing, the conductive cover enclosing the conductive casing; and a packaging board formed on the circuit board assembly, the packaging board comprising an insulator and an inner wiring layer arranged in the insulator, the packaging board defining a slot for partially exposing the inner wiring layer, the conductive casing received in the slot and connected to the exposed inner wiring layer.

7. The packaging structure of claim 6, wherein the wiring layer comprises a pad exposed from the cavity, the electronic component comprises a main body and a pin connected to the main body, and the pin is connected to the pad.

8. The packaging structure of claim 6, wherein the conductive cover comprises a first portion and a second portion wider than the first portion, the first portion is inserted into the conductive casing, and the second portion is located on a top end of the conductive casing.

9. The packaging structure of claim 8, wherein a thickness of the second portion is at least 10 microns.

10. The packaging structure of claim 7, wherein the circuit substrate further comprises a conductive body, and the conductive body extends through the base layer and connected to the pad.

11. The packaging structure of claim 6, wherein the circuit board assembly further comprises a first protective film on the first wiring layer, and the first protective film defines a window for the conductive casing to extend through.

12. The packaging structure of claim 6, wherein the heat conductive medium comprises a fluorinated liquid.

* * * * *